(12) United States Patent
Nicklasson

(10) Patent No.: US 6,741,131 B2
(45) Date of Patent: May 25, 2004

(54) DC-COMPENSATION LOOP FOR VARIABLE GAIN AMPLIFIER

(75) Inventor: Lars Nicklasson, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 10/353,653

(22) Filed: Jan. 29, 2003

(65) Prior Publication Data

US 2004/0056718 A1 Mar. 25, 2004

Related U.S. Application Data

(60) Provisional application No. 60/412,826, filed on Sep. 23, 2002.

(51) Int. Cl.[7] .............................. H03F 3/45; H03F 1/02; H03F 1/36
(52) U.S. Cl. .............................. 330/254; 330/9; 330/85
(58) Field of Search .............................. 330/254, 9, 85

(56) References Cited

U.S. PATENT DOCUMENTS

| | | | |
|---|---|---|---|
| 3,430,154 A | 2/1969 | Harwood | 330/19 |
| 5,068,626 A | 11/1991 | Takagi et al. | 331/17 |
| 5,724,653 A * | 3/1998 | Baker et al. | 455/296 |
| 5,757,230 A * | 5/1998 | Mangelsdorf | 330/133 |
| 5,812,025 A * | 9/1998 | Shimazaki | 330/129 |
| 5,880,641 A | 3/1999 | Kim | 330/303 |
| 5,990,748 A * | 11/1999 | Tomasini et al. | 330/292 |
| 6,194,958 B1 | 2/2001 | Goldfarb et al. | 327/552 |
| 6,288,604 B1 | 9/2001 | Shih et al. | 330/9 |
| 6,304,144 B1 | 10/2001 | Yamazaki et al. | 330/259 |
| 6,332,205 B1 * | 12/2001 | Conway | 714/746 |
| 6,392,478 B1 | 5/2002 | Mulder et al. | 330/86 |
| 6,441,686 B1 | 8/2002 | Nakamura | 330/85 |

FOREIGN PATENT DOCUMENTS

| | | |
|---|---|---|
| EP | 0 874 453 A2 | 10/1998 |
| EP | 1 193 857 A2 | 4/2002 |

OTHER PUBLICATIONS

Tyberghien, G., Standard Search Report prepared by the European Patent Office, Mar. 25, 2003, (4 pgs.).

* cited by examiner

Primary Examiner—Patricia Nguyen
(74) Attorney, Agent, or Firm—Jenkens & Gilchrist, P.C.

(57) ABSTRACT

An apparatus consisting of a variable gain amplifier having an input and an output having a DC-offset compensation loop connected between the output and the input of the variable gain amplifier. The DC-offset compensation loop having a gain independent cutoff frequency.

6 Claims, 2 Drawing Sheets

DC-COMPENSATION LOOP FOR VARIABLE GAIN AMPLIFIER

RELATED APPLICATION(S)

This application claims priority from and incorporates herein by reference the entire disclosure of U.S. Provisional Application Serial No. 60/412,826 filed Sep. 23, 2002.

TECHNICAL FIELD

The present invention relates to variable gain amplifiers, and more particularly, to variable gain amplifiers including DC-compensation loops having a gain independent high pass filter cut off frequency.

BACKGROUND OF THE INVENTION

A variable gain amplifier alters the gain of an input voltage signal based upon a provided input variable. Within microcircuit design, DC-offsets arc generated by variable gain amplifiers due to component mismatches. For higher gain amplifiers, it is necessary for the DC-offset to be removed. The DC-offset comprises a direct current level that is added to the input signal of the amplifier. The DC-offset of a variable gain amplifier may be removed by using DC blocking capacitors or DC feedback loops. However, for baseband frequency applications, capacitors are too large for integration within microcircuit amplifiers. For variable gain amplifier applications, conventional DC feedback loops causes a gain dependent cutoff frequency. Thus, there is a need for an improved method of DC-offset removal that does not suffer from the limitations of the prior art.

SUMMARY OF THE INVENTION

The present invention overcomes the foregoing and other problems with a variable gain amplifier having an input and an output with a DC-offset compensation loop connected between the input and output. The DC-offset compensation loop has a gain independent cut off frequency and removes DC-offsets from the output of the variable gain amplifier.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION

Figure 1:
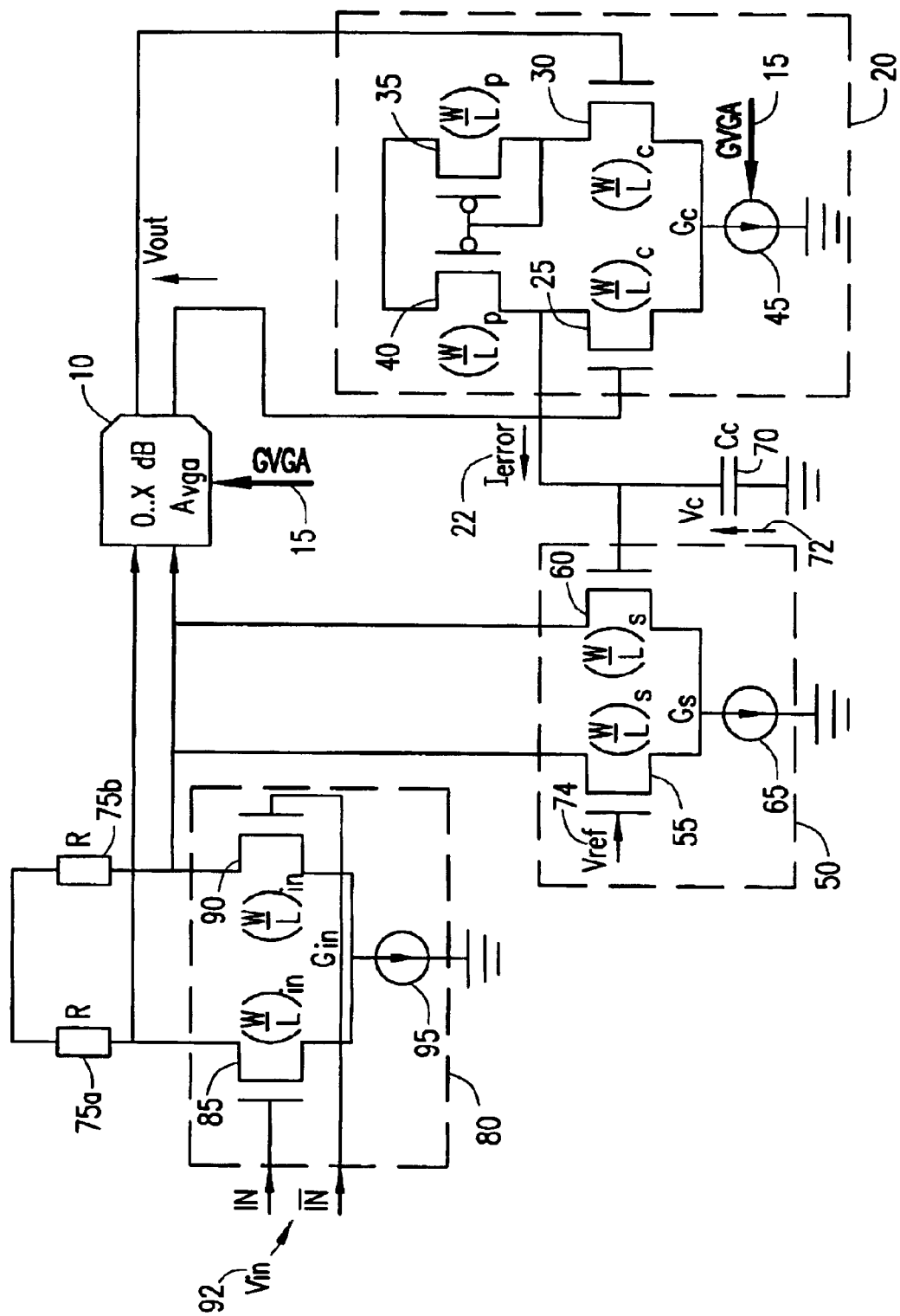
FIG. 1 is a schematic diagram of a variable gain amplifier including a DC-compensation loop with a gain independent high pass filter cut off frequency.

Referring now to the drawings, and more particularly to FIG. 1, the variable gain amplifier 10 amplifies an input signal responsive to a digital word input 15. The output of the variable gain amplifier 10 is connected to a first transconductance amplifier 20. The first transconductance amplifier 20 consists of transistors 25, 30, 35 and 40 connected to a programmable current source 45. The programmable current source 45 is responsive to a digital word input 15 which is the same as the input provided to the variable gain amplifier 10. The first transconductance amplifier 20 is connected to a second transconductance amplifier 50 consisting of transistors 55 and 60 and a current source 65. Additionally, the first transconductance amplifier 20 is connected to a capacitor 70 that integrates the error current 22 from the transconductance amplifier 20.

The second transconductance amplifier 50 compares an integrated voltage 72 of the capacitor 70 with a reference voltage 74 to generate an offset canceling current pair. The offset canceling current pair is provided to the input of the variable gain amplifier 10 and to a pair of drain resistors 75 connected to an input transconductance amplifier 80. The input transconductance amplifier 80 consists of transistor 85 and 90 and a bias current source 95 and receives the input signal 92 for the variable gain amplifier 10. The input transconductance amplifier 80 and drain resistor pair 75 generate an offset canceling input voltage to the variable gain amplifier 10 responsive to the input signal 92 and the offset canceling current pair. The offset canceling input voltage cancels the DC-offset voltage of the transconductance amplifier 10.

Figure 2:
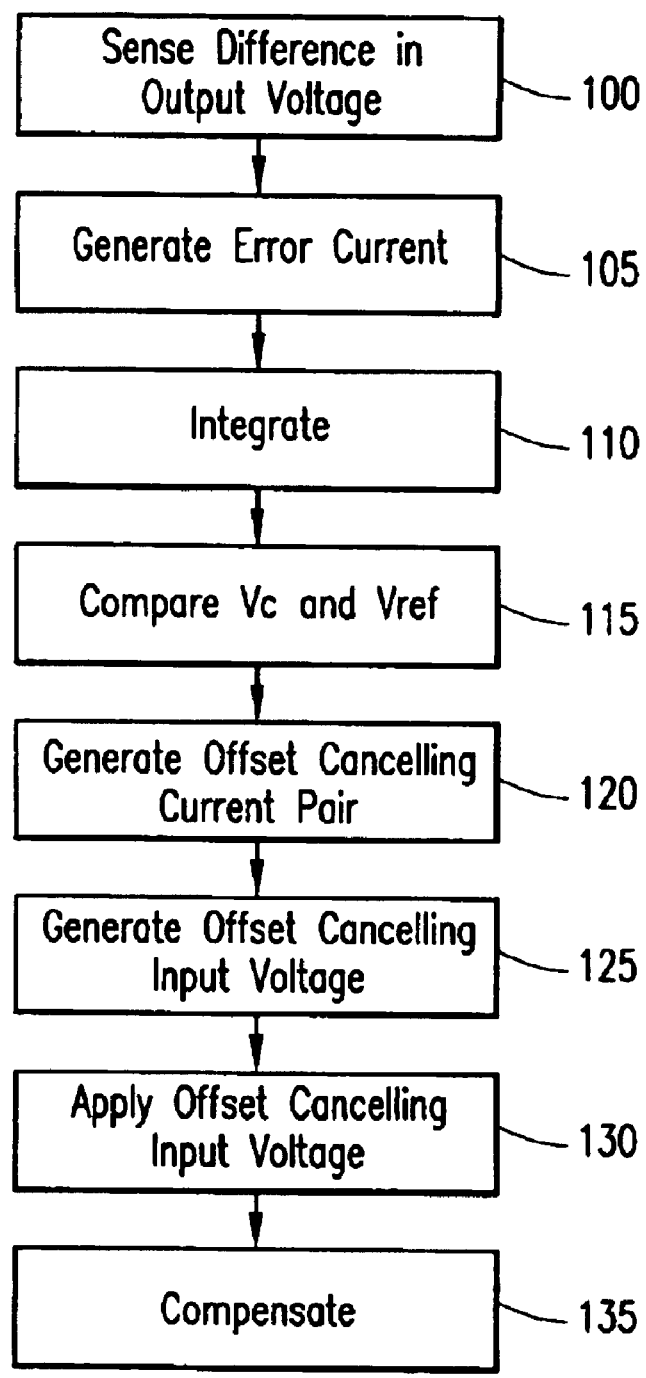
FIG. 2 is a block diagram describing the process by which the schematic of FIG. 1 operates.

Referring now to FIG. 2, there is more fully described the operation of the circuit described with respect to FIG. 1. The difference in output voltage from the outputs of the variable gain amplifier 10 is determined at step 100 by the transconductance amplifier 20. The transconductance amplifier 20 generates an error current at step 105 as a function of the difference in output voltage of the variable gain amplifier 20 multiplied by the bias current of the transconductance amplifier 20. The value of the bias current provided by the programmable bias current source 45 is controlled by the same digital word input 15 that controls the gain of the variable gain amplifier 10.

The error current generated by the transconductance amplifier 20 is integrated at step 110 by capacitor 70. The integrated capacitor voltage $V_c$ 72 produced by the capacitor 70 is compared at step 115 to a reference voltage $V_{ref}$ 74. The difference between the reference voltage $V_{ref}$ 74 and the integrated capacitor voltage $V_c$ 72 controls transconductance amplifier 50. Transconductance amplifier 50 generates an offset canceling current pair at step 120. The generated offset canceling current pair is fed at step 125 through a pair of drain resistors 75 of input transconductance amplifier 80. Input transconductance amplifier 80 generates an offset canceling input voltage responsive to the input signal 92 and the offset cancelling current pair at step 130 which is provided to the input of variable gain amplifier 10. The feedback loop forces the offset canceling input voltage to a value that at the output of the variable gain amplifier 10 would be equal in magnitude but opposite in sign to the original output DC voltage at the variable gain amplifier output. Thus, resulting in a perfect DC-offset voltage compensation at step 135 at the variable gain amplifier output.

The described circuit provides a variable gain amplifier with a DC compensation loop having a cutoff frequency that is gain independent. The feedback gain is controlled by programmable current source 45 that uses the same digital word that controls the gain of the variable gain amplifier. This provides a flexible solution since a current may easily be controlled over a large range of values.

The previous description is of a preferred embodiment for implementing the invention, and the scope of the invention should not necessarily be limited by this description. The scope of the present invention is instead defined by the following claims.

What is claimed is:

1. An apparatus, comprising:
   a variable gain amplifier having an input and an output;
   a DC-offset compensation loop connected between the output and the input of the variable gain amplifier, said DC-offset compensation loop having a gain independent cut off frequency; and wherein the variable gain amplifier and the DC-offset compensation loop are controlled responsive to a same digital code word input.

2. The apparatus of claim 1, wherein the DC-offset compensation loop further comprises:

a first transconductance amplifier for generating an error current responsive to an output voltage of the variable gain amplifier and a bias current of the first transconductance amplifier;

a capacitor for integrating the error current and providing an integrated capacitor voltage;

a second transconductance amplifier for generating an offset canceling current pair responsive to a difference between the integrated capacitor voltage and a reference voltage;

an input transconductance amplifier connected to the input of the variable gain amplifier for generating a DC-offset canceling voltage responsive to the offset canceling current pair and an input signal.

3. The apparatus of claim 2, wherein the input transconductance amplifier further comprises a pair of drain resistors connected to receive the offset canceling current pair.

4. The apparatus of claim 2, further including a programmable current source responsive to a digital word input for generating the bias current.

5. An apparatus, comprising:

a variable gain amplifier responsive to a digital word input for controlling a gain of the variable gain amplifier having an input and an output;

a programmable current source responsive to the digital word input for generating a bias current;

a first transconductance amplifier for generating an error current responsive to an output voltage of the variable gain amplifier and the bias current of the programmable current source;

a capacitor for integrating the error current and providing an integrated capacitor voltage;

a second transconductance amplifier for generating an offset canceling current pair responsive to a difference between the integrated capacitor voltage and a reference voltage; and an input transconductance amplifier connected to the input of the variable gain amplifier for generating a DC-offset canceling voltage responsive to the offset canceling current pair and an input signal, wherein the input transconductance amplifier further comprises a pair of drain resistors connected to receive the offset canceling current pair.

6. A method for DC-offset compensation with a variable gain amplifier, comprising the steps of:

sensing a difference in output voltage at outputs of the variable gain amplifier;

generating an error current responsive to the difference in the output voltage and a bias current, wherein the bias current is controlled by a digital control word that also controls a gain of the variable gain amplifier;

integrating the error current and producing an integrated voltage;

determining a difference between the integrated voltage and a reference voltage;

generating an offset canceling current pair responsive to the determined difference and an input signal; and generating a DC-offset canceling voltage signal at the input of the variable gain amplifier responsive to the offset canceling current pair.

* * * * *

UNITED STATES PATENT AND TRADEMARK OFFICE
CERTIFICATE OF CORRECTION

PATENT NO. : 6,741,131 B2  
DATED : May 25, 2004  
INVENTOR(S) : Lars Nicklasson Page 1 of 1

It is certified that error appears in the above-identified patent and that said Letters Patent is hereby corrected as shown below:

Column 1,
Line 19, replace "arc generated" with -- are generated --

Signed and Sealed this

Sixteenth Day of November, 2004

JON W. DUDAS
*Director of the United States Patent and Trademark Office*

UNITED STATES PATENT AND TRADEMARK OFFICE
CERTIFICATE OF CORRECTION

PATENT NO. : 6,741,131 B2  Page 1 of 1
APPLICATION NO. : 10/353653
DATED : May 25, 2004
INVENTOR(S) : Nicklasson It is certified that error appears in the above-identified patent and that said Letters Patent is hereby corrected as shown below:

In Fig. 1, Sheet 1 of 2, delete " 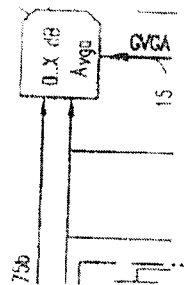 " and insert

-- 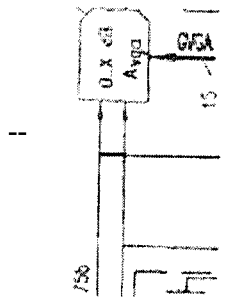 --, therefor.

Signed and Sealed this

Tenth Day of March, 2009

JOHN DOLL
*Acting Director of the United States Patent and Trademark Office*